United States Patent
Yamashita

(10) Patent No.: US 8,520,711 B2
(45) Date of Patent: Aug. 27, 2013

(54) OPTICAL DEVICE AND METHOD FOR CONTROLLING THE SAME

(75) Inventor: Hidetoshi Yamashita, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 0 days.

(21) Appl. No.: 13/444,309

(22) Filed: Apr. 11, 2012

(65) Prior Publication Data

US 2012/0269213 A1    Oct. 25, 2012

(30) Foreign Application Priority Data

Apr. 25, 2011    (JP) ................. 2011-097209

(51) Int. Cl.
*H01S 3/00*    (2006.01)

(52) U.S. Cl.
USPC .............. 372/38.02; 372/38.07; 372/38.01; 372/29.015; 372/29.011

(58) Field of Classification Search
USPC .............. 372/38.02, 38.07, 38.01, 29.015, 372/29.011
See application file for complete search history.

(56) References Cited

U.S. PATENT DOCUMENTS

| | | | |
|---|---|---|---|
| 8,130,251 B2 | 3/2012 | Yamashita | |
| 8,164,611 B2 | 4/2012 | Yamashita | |
| 8,203,585 B2 | 6/2012 | Yamashita | |
| 2003/0112323 A1* | 6/2003 | Shirota et al. | 347/246 |
| 2009/0314927 A1* | 12/2009 | Tatsuno et al. | 250/205 |
| 2010/0033508 A1* | 2/2010 | Mizushima et al. | 345/690 |
| 2012/0007933 A1 | 1/2012 | Yamashita | |
| 2012/0069128 A1 | 3/2012 | Yamashita et al. | |

FOREIGN PATENT DOCUMENTS

| | | |
|---|---|---|
| JP | 2002-298354 | 10/2002 |
| JP | 2009-255547 | 11/2009 |
| JP | 2010-94980 | 4/2010 |
| JP | 2012-61771 | 3/2012 |

OTHER PUBLICATIONS

U.S. Appl. No. 13/488,592, filed Apr. 17, 2012, Yamashita.

* cited by examiner

*Primary Examiner* — Kinam Park
(74) *Attorney, Agent, or Firm* — Oblon, Spivak, McClelland, Maier & Neustadt, L.L.P.

(57) ABSTRACT

An optical device includes: a light source that emits laser beams; a detecting unit that detects the laser beams and converts light amounts of the detected laser beams into voltage values; a first storage unit that stores in advance a light amount to be output for each of the laser beams and the voltage value; a second storage unit that stores in advance a value indicating light use efficiency of an optical system that guides the laser beams to a surface to be scanned for scanning; a calculating unit that calculates a target voltage value for each of the laser beams based on the light amount and the voltage value and also on the value indicating the light use efficiency; and a control unit that controls emission power for each of the laser beams so that the voltage value output from the detecting unit approaches the target voltage value.

6 Claims, 13 Drawing Sheets

FIG.6

| ch NUMBER | ROM AREA | |
|---|---|---|
| | EMISSION POWER OF LIGHT SOURCE UNIT | MONITORED VOLTAGE ASSOCIATED WITH EMISSION POWER |
| 1 | Pm_1 | Vm_1 |
| 2 | Pm_2 | Vm_2 |
| 3 | Pm_3 | Vm_3 |
| 4 | Pm_4 | Vm_4 |
| 5 | Pm_5 | Vm_5 |
| ⋮ | ⋮ | ⋮ |
| 39 | Pm_39 | Vm_39 |
| 40 | Pm_40 | Vm_40 |
| COMMON | LIGHT USE EFFICIENCY $\eta$ OF WRITING UNIT | |

Rows 1–40: LIGHT SOURCE UNIT
COMMON row: WRITING UNIT

FIG.13

| ch NUMBER | ROM AREA | |
|---|---|---|
| | EMISSION POWER OF LIGHT SOURCE UNIT | MONITOR VOLTAGE ASSOCIATED WITH EMISSION POWER |
| 1 | Pm_1 | Vm_1 |
| 2 | Pm_2 | Vm_2 |
| 3 | Pm_3 | Vm_3 |
| 4 | Pm_4 | Vm_4 |
| 5 | Pm_5 | Vm_5 |
| ⋮ | ⋮ | ⋮ |
| 39 | Pm_39 | Vm_39 |
| 40 | Pm_40 | Vm_40 |
| COMMON | LIGHT USE EFFICIENCY $\eta_a$ OF FIRST-COLOR WRITING UNIT | |
| COMMON | LIGHT USE EFFICIENCY $\eta_b$ OF SECOND-COLOR WRITING UNIT | |

Rows 1–40: LIGHT SOURCE UNIT; COMMON rows: WRITING UNIT

FIG.14

| ch NUMBER | ROM AREA | |
|---|---|---|
| | EXPOSURE POWER | MONITOR VOLTAGE ASSOCIATED WITH EMISSION POWER |
| 1 | P_1 | Vm_1 |
| 2 | P_2 | Vm_2 |
| 3 | P_3 | Vm_3 |
| 4 | P_4 | Vm_4 |
| 5 | P_5 | Vm_5 |
| ⋮ | ⋮ | ⋮ |
| 39 | P_39 | Vm_39 |
| 40 | P_40 | Vm_40 |

FIG.15

| ch NUMBER | ROM AREA | |
|---|---|---|
| | EXPOSURE POWER | MONITOR VOLTAGE ASSOCIATED WITH EMISSION POWER |
| 1 | P1_1 | Vm1_1 |
| 2 | P1_2 | Vm1_2 |
| 3 | P1_3 | Vm1_3 |
| 4 | P1_4 | Vm1_4 |
| 5 | P1_5 | Vm1_5 |
| ⋮ | ⋮ | ⋮ |
| 39 | P1_39 | Vm1_39 |
| 40 | P1_40 | Vm1_40 |
| 1 | P2_1 | Vm2_1 |
| 2 | P2_2 | Vm2_2 |
| 3 | P2_3 | Vm2_3 |
| 4 | P2_4 | Vm2_4 |
| 5 | P2_5 | Vm2_5 |
| ⋮ | ⋮ | ⋮ |
| 39 | P2_39 | Vm2_39 |
| 40 | P2_40 | Vm2_40 |

Rows 1–40 (first block): FIRST COLOR
Rows 1–40 (second block): SECOND COLOR

OPTICAL DEVICE AND METHOD FOR CONTROLLING THE SAME

CROSS-REFERENCE TO RELATED APPLICATIONS

The present application claims priority to and incorporates by reference the entire contents of Japanese Patent Application No. 2011-097209 filed in Japan on Apr. 25, 2011.

BACKGROUND OF THE INVENTION

1. Field of the Invention

The present invention relates to an optical device that uses a light source for emitting a plurality of laser beams simultaneously and a method for controlling the optical device.

2. Description of the Related Art

Single-beam semiconductor lasers have been widely used in apparatuses for writing data to media using laser beams. Examples of such apparatuses include a laser printer, an optical disk device, and a digital copying machine.

However, in recent years, an laser diode array (LDA) capable of simultaneously emitting a plurality of beams, typically 2 to 4 beams, and a vertical cavity surface emitting laser (VCSEL) capable of simultaneously emitting approximately 40 laser beams have been developed so as to achieve higher speed and resolution. An image forming apparatuses that performs image formation at higher resolution and higher speed by employing an LDA or a VCSEL as a laser-beam light source for exposing a photosensitive element has been put to practical use.

Meanwhile, LDAs and VCSELs are more costly than single-beam semiconductor lasers. Therefore, a beam-splitting method is proposed in which a beam emitted from an LDA or a VCSEL is split into two beams using a half-mirror prism so as to illuminate photosensitive elements corresponding to two colors. Use of the beam-splitting method can reduce the number of the LDAs or VCSELs by half while keeping the same level of resolution and processing speed, thereby reducing a manufacturing cost.

Meanwhile, a laser beam used for illuminating a photosensitive element needs to emit light with a predetermined light amount. Therefore, adjustment of the light amount is performed at, for instance, an assembly plant in which image forming units including light sources are assembled. The adjustment of the light amount is generally performed by providing, for example, a photodiode (PD) that receives a laser beam to monitor a light amount on a photosensitive element, which is a surface to be scanned, of the PD. In a state where the PD is caused to emit a laser beam, the light amount is adjusted to a target light amount by manually operating a variable resistor that controls the output power of the laser beam according to the output power of the PD.

Accordingly, the greater the number of laser beams for use in exposing a photosensitive element, the longer time is required to adjust amounts of light in the assembly plant, resulting in an increase in an assembly cost. It is also required to mount as many variable resistors for adjusting light amount as the laser beams, resulting in an increase in the size of an electronic circuit.

To solve this problem, there has already been known a technology that suppresses an increase in the time needed for adjusting a light amount and an increase in a circuit size by employing an automatic adjustment of the light amount in lieu of a manual adjustment of the light amount by using variable resistors. The automatic adjustment is performed by storing in advance the output power of the PD at which the target light amount is achieved.

For example, disclosed in Japanese Patent Application Laid-open No. 2002-298354 is a technology according to which predetermined emission power of a laser beam and a monitored voltage corresponding to the emission power are stored in a memory. According to the technology disclosed in Japanese Patent Application Laid-open No. 2002-298354, a relational expression between apparatus-specific monitored voltages and laser drive currents, which are based on output power, is determined from the monitored voltages stored in the memory. Then, based on a currently monitored voltage and the relational expression, emission power is monitored and drive currents are controlled to thereby achieve reduction in a circuit size.

However, the conventional method for adjusting the light amount only performs recording adjustment values for the variable resistor as digital values, by which accuracy in the adjustment of the light amount is not improved.

Meanwhile, there is proposed a beam-splitting method that splits each laser beam into two beams using an optical splitting prism and two polygon mirrors having different angles of reflection and that causes the two laser beams to respectively illuminate two photosensitive elements used for different image-forming colors. Conventionally in this beam-splitting method, adjustment of the light amount in a writing unit that generates scanning beams by deflecting the laser beams has been performed for each of the photosensitive elements corresponding to two colors. The number of adjustments to be performed in this case is (the number of the laser beams)×(two(=the number of colors)), amounting to twice that required for a normal method that does not employ the beam-splitting method. Furthermore, when the beam-splitting method is employed, a storage medium having a larger storage capacity is required because data corresponding to (the number of the laser beams)×(two(=the number of colors)) is to be stored in the storage medium.

FIG. 14 illustrates an example of adjustment data for a writing unit that scans one photosensitive element without performing laser-beam splitting using a 40-channel VCSEL capable of emitting 40 laser beams at a time. In this case, pairs of exposure power and monitored voltages for the 40 channels are stored in a storage medium. FIG. 15 illustrates an example of adjustment data for a writing unit that uses a VCSEL identical to that illustrated in FIG. 14 but splits each of the laser beams of the 40 channels into two beams by the beam-splitting method so as to scan each of photosensitive elements corresponding to two colors. When the beam-splitting method is used, pairs of exposure power and monitored voltages for the two colors are stored in a storage medium in this way.

In the light amount adjusting process performed in the writing unit, the light amount of a laser beam is measured when the laser beam reaches a position of the photosensitive element via optical components including a plurality of lenses and a polygon mirror. Accordingly, the light amount of the laser beam on the photosensitive element is considerably minute as compared with the light amount of the laser beam immediately after the emission.

When the number of laser beams is increased, the light amount per laser beam becomes more minute (a few to ten-plus microwatts) and more sensitive to a noise, making it difficult to obtain satisfactory adjustment accuracy. As a result, there has been a problem that a large difference in the amounts of light develops among laser beams during scanning of a photosensitive element even after the adjustment of the amounts of light has been performed, thereby causing uneven concentration in an image.

Thus, when a laser light source capable of simultaneously emitting a plurality of laser beams is used, there is a need for increasing accuracy in adjusting the amounts of light of the laser beams emitted from the laser light source.

SUMMARY OF THE INVENTION

It is an object of the present invention to at least partially solve the problems in the conventional technology.

An optical device includes: a light source that emits a plurality of laser beams; a detecting unit that detects the laser beams emitted from the light source and converts light amounts of the detected laser beams into voltage values to be output; a first storage unit that stores in advance a light amount to be output for each of the laser beams and the voltage value corresponding to the light amount in an associated manner; a second storage unit that stores in advance a value indicating light use efficiency of an optical system that guides the laser beams to a surface to be scanned for scanning; a calculating unit that calculates a target voltage value, which is the voltage value to be output from the detecting unit when the surface to be scanned is irradiated with the laser beam at a preset target light amount, for each of the laser beams based on the light amount and the voltage value, which are stored in the first storage unit, and also based on the value indicating the light use efficiency stored in the second storage unit; and a control unit that controls emission power for each of the laser beams emitted from the light source so that the voltage value output from the detecting unit approaches the target voltage value calculated by the calculating unit.

A method for controlling an optical device includes: detecting, performed by a detecting unit, a laser beam emitted from the light source used for emitting a plurality of the laser beams, converting a light amount of the detected laser beam into a voltage value, and outputting the voltage value; calculating, performed by a calculating unit for each of the plurality of laser beams, a target voltage value that is the voltage value to be output at the detecting when the surface to be scanned is irradiated with the laser beam at a preset target light amount based on an output light amount for each of the laser beams and the voltage value associated with the output light amount stored in the first storage unit and a value, stored in the second storage unit, indicating light use efficiency of an optical system that guides the laser beams to the surface to be scanned and causes the laser beams to scan the surface to be scanned; and controlling, performed by a control unit, emission power of the laser beams emitted from the light source so that the voltage value output at the detecting approaches the target voltage value calculated at the calculating.

An optical device includes: a light emitting means for emitting a plurality of laser beams; a detecting means for detecting the laser beams emitted from the light emitting means and converting light amounts of the detected laser beams into voltage values to be output; a first storage means for storing in advance a light amount to be output for each of the laser beams and the voltage value corresponding to the light amount in an associated manner; a second storage means for storing in advance a value indicating light use efficiency of an optical means for guiding the laser beams to a surface to be scanned for scanning; a calculating means for calculating a target voltage value, which is the voltage value to be output from the detecting means when the surface to be scanned is irradiated with the laser beam at a preset target light amount, for each of the laser beams based on the light amount and the voltage value, which are stored in the first storage means, and also based on the value indicating the light use efficiency stored in the second storage means; and a control means for controlling emission power for each of the laser beams emitted from the light emitting means so that the voltage value output from the detecting means approaches the target voltage value calculated by the calculating means.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 6 is a schematic diagram illustrating an example of memory contents according to the embodiment;

FIG. 13 is a schematic diagram illustrating an example of memory contents according to a second modification of the embodiment;

FIG. 14 is a schematic diagram illustrating an example of adjustment data for a writing unit that scans a photosensitive element with a single laser beam by using a 40-channel VCSEL; and FIG. 15 is a schematic diagram illustrating an example of adjustment data for a writing unit that uses the 40-channel VCSEL and splits each of laser beams emitted from the VCSEL into two beams so as to scan each of photosensitive elements corresponding to two colors.

DETAILED DESCRIPTION OF THE PREFERRED EMBODIMENTS

Figure 1:
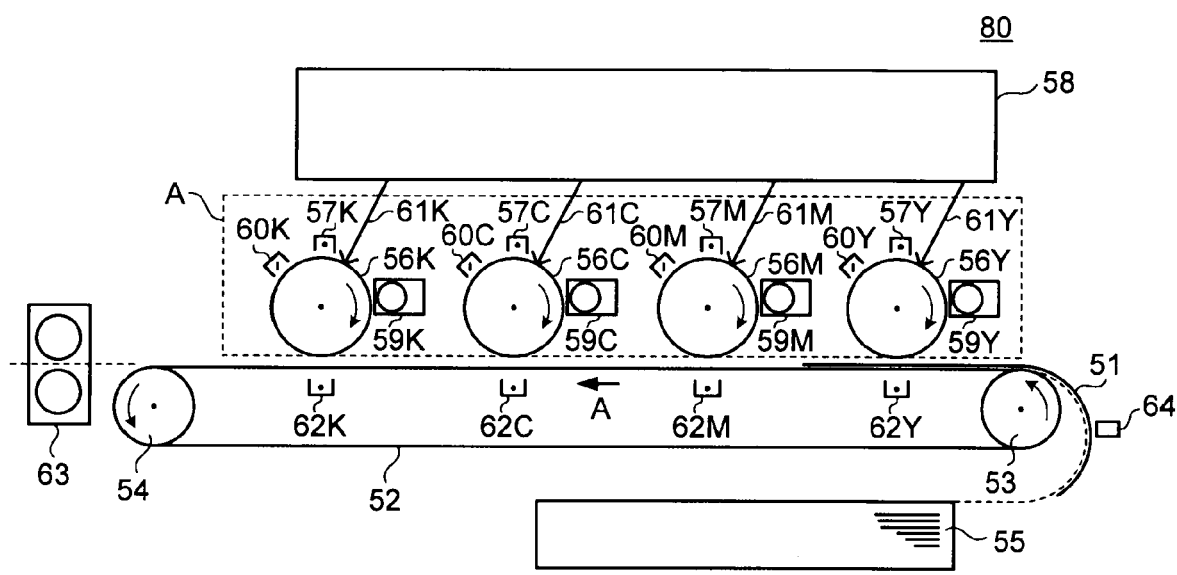
FIG. 1 is a diagram schematically illustrating an exemplary configuration of an image forming apparatus to which an optical device according to an embodiment is applicable.

An exemplary embodiment is described in detail below with reference to the accompanying drawings. FIG. 1 is a diagram schematically illustrating an exemplary configuration of an image forming apparatus 80 to which an optical device according to the embodiment is applicable. The image forming apparatus 80 is a tandem-type color-image forming apparatus that can form a color image using colors including yellow (Y), magenta (M), cyan (C), and black (K).

The image forming apparatus 80 includes an image forming portion A including first to fourth image forming sections that form Y, M, C, and K images, respectively. The first to fourth image forming sections are linearly arranged along a conveying belt 52 that conveys transfer paper 51. The conveying belt 52 is suspended between conveying rollers 53 and 54, between which one is a drive roller and the other is a driven roller. The conveying belt 52 is rotated in a direction indicated by arrow B in FIG. 1 by the rotation of the conveying rollers 53 and 54.

Provided below the conveying belt 52 is a paper feed tray 55 that houses the transfer paper 51. Transfer paper positioned at an uppermost position among pieces of the transfer paper 51 in the paper feed tray 55 is fed therefrom when image formation is performed. Then, the conveyance of the transfer paper is synchronized with an operation of an optical unit that performs image writing by a registration sensor 64, and attracted onto the conveying belt 52 by electrostatic attraction.

The attracted transfer paper 51 is conveyed to the first image forming section for forming a yellow image where a yellow image is formed on the transfer paper 51. The first image forming section includes, in addition to a photosensitive element 56Y, a charging unit 57Y, an exposing unit 58, a developing unit 59Y, and a photosensitive element cleaning unit 60Y that are arranged around the photosensitive element 56Y. A surface of the photosensitive element 56Y is uniformly charged by the charging unit 57Y, and thereafter subjected to exposure performed by the exposing unit 58 with laser light 61Y in accordance with the yellow image. Hence, an electrostatic latent image of the yellow image is formed on the surface of the photosensitive element 56Y.

Meanwhile, an electrostatic latent image is formed by main-/sub-scanning optical beam writing. Optical beam writing of a two-dimensional image to the photosensitive surface of the photosensitive element is performed by the main scanning that is a beam scanning using a light beam emitted from the exposing unit 58, and sub scanning that is rotation of the photosensitive element in a direction perpendicular to a main scanning direction.

The electrostatic latent image formed on the photosensitive element 56Y is developed by the developing unit 59Y. Thus, a toner image is formed on the photosensitive element 56Y. This toner image is transferred by a transfer unit 62Y at a position (transfer position) where the photosensitive element 56Y is brought into contact with the transfer paper P on the conveying belt 52 to form a single-color yellow image on the transfer paper 51. The photosensitive element cleaning unit 60Y performs cleaning by removing residual toner remaining on the surface of the photosensitive element 56Y from which the toner image has been transferred to make the photosensitive element 56Y ready for next image formation.

As described above, the transfer paper 51 onto which the single color yellow image has been transferred in the first image forming section is conveyed by the conveying belt 52 to the second image forming section that forms a magenta image. In the second image forming section, a magenta toner image is formed on a photosensitive element 56M, in a similar manner as in the first image forming section, and transferred onto the yellow image having already been formed on the transfer paper 51 in a superimposed manner. The transfer paper 51 is further conveyed to the third image forming section that forms a cyan image and subsequently to the fourth image forming section that forms a black image where a cyan toner image and a black toner image that are formed, in a similar manner as in the case of the yellow and magenta toner images, are transferred onto an image formed immediately before in the superimposed manner. Upon completion of transfer of each color of Y, M, C, and K, a color image is obtained.

In the mean time, similarly to the first image forming section, the second to fourth image forming sections include elements 56(M, C, and K), 57(M, C, and K), 59(M, C, and K), 60(M, C, and K), 61(M, C, and K), and 62(M, C, and K), which correspond to the colors of magenta, cyan, and black, respectively.

The transfer paper 51 which has passed through the fourth image forming section and on which the color image has been formed is peeled off from the conveying belt 52, subjected to a fixing device 63 for fixation, and thereafter discharged.

Figure 2:
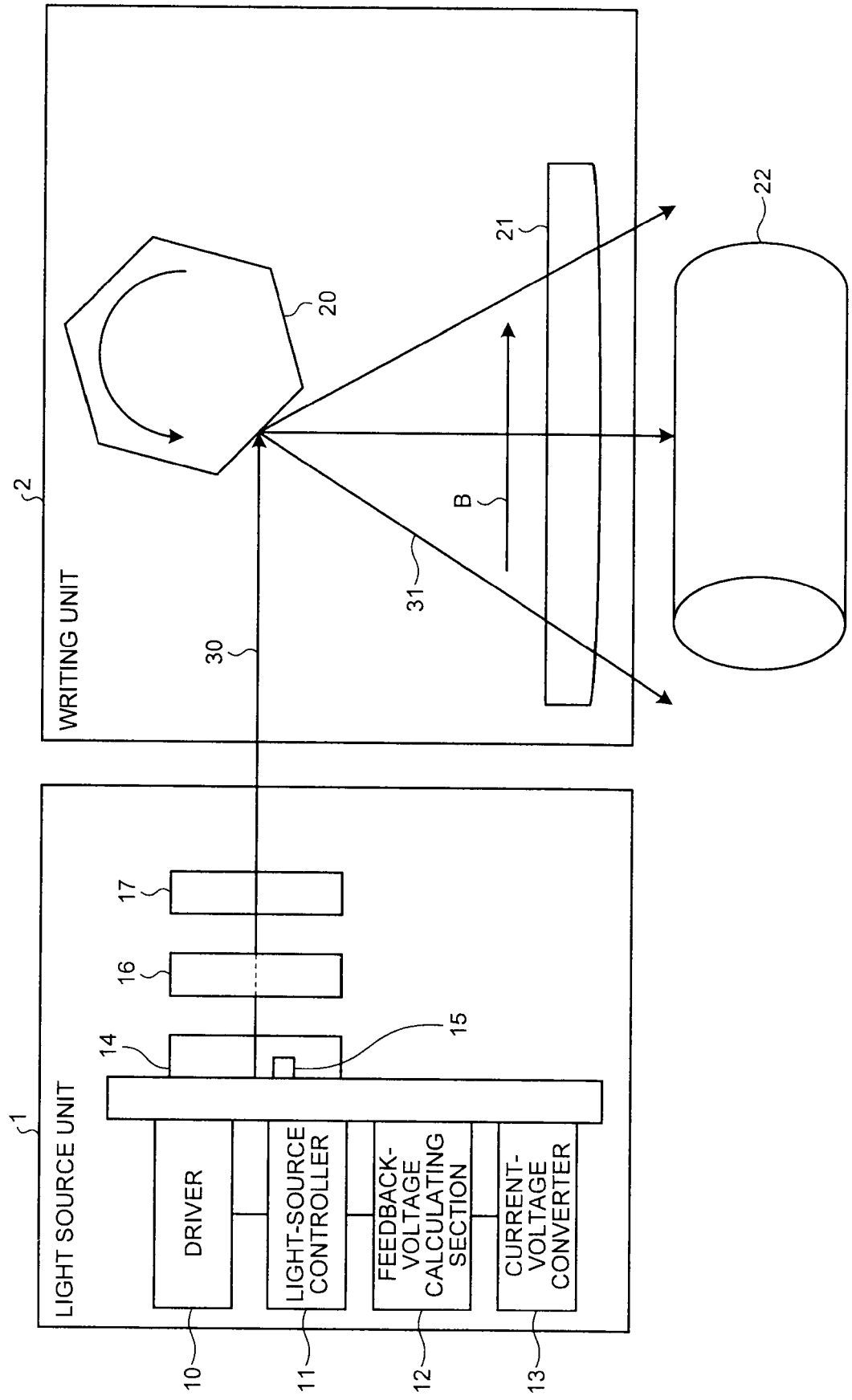
FIG. 2 is a schematic diagram illustrating an exemplary configuration of an optical device applicable to the embodiment.

FIG. 2 is a diagram schematically illustrating an exemplary configuration of an optical device that is included in the exposing unit 58 of the image forming apparatus 80 illustrated in FIG. 1 and is applicable to the embodiment. The optical device includes a light source section that emits a laser beam 30, a light source unit 1 that includes a light receiving section for receiving the laser beam 30 so as to measure a light amount of the laser beam 30 emitted from the light source section, and a writing unit 2 that includes an optical system for guiding the laser beam 30 emitted from the light source section onto a photosensitive element 22.

The light source section in the optical device includes, in addition to a laser-beam light source 14 capable of emitting a plurality of laser beams, a driver 10 related to drive control of the laser-beam light source 14, a light-source controller 11, a feedback-voltage calculating section 12, and a current-voltage converter 13. The light-source controller 11 is implemented as, for example, application specific integrated circuit (ASIC).

The laser-beam light source 14 has a plurality of channels and is capable of simultaneously emitting a plurality of laser beams corresponding to the plurality of channels. As the laser-beam light source 14, for example, a laser diode array (LDA) that is configured as an array of a plurality of laser diodes can be used. However, the laser-beam light source 14 is not limited thereto; a vertical cavity surface emitting laser (VCSEL) can be used as the laser-beam light source 14. In this case, the laser-beam light source 14 can emit dozens of (for example, 40) laser beams corresponding to dozens of channels (for example, 40 channels).

The optical system includes a coupling optical element 16, an aperture 17, a polygon mirror 20, and an fθ lens 21. The laser beam 30 emitted from the laser-beam light source 14 is transformed into parallel light by the coupling optical element 16, thereafter shaped through the aperture 17, and incident on and deflected by the polygon mirror 20 that is rotating at a predetermined rotation speed to thus become a scanning beam 31. The photosensitive element 22 is irradiated with the scanning beam 31 that has passed through the fθ lens 21. The scanning beam 31 scans the photosensitive element 22 in the main-scanning direction (indicated by arrow B in FIG. 2) in accordance with the rotation of the polygon mirror 20.

In the example illustrated in FIG. 2, the laser-beam light source 14 of the light source unit 1 includes a photodetector 15 for monitoring a light amount of a laser beam emitted from the laser-beam light source 14. The photodetector 15 is, for example, formed by a photodiode (PD). The photodetector 15 converts an incident laser beam into a signal that is an electric current which depends on a light amount P of the laser beam by photoelectric conversion, and outputs the signal. The electric current output from the photodetector 15 is converted into a voltage in the current-voltage converter 13 using a resistance element or the like, and supplied to the feedback-voltage calculating section 12 as a monitored voltage Vpd.

When, for example, an LDA is used as the laser-beam light source 14, the photodetector 15 is disposed so that a back beam of the LDA is incident on the photodetector 15. However, when a VCSEL is used as the laser-beam light source 14, the VCSEL does not emit a back beam. Therefore, a half mirror and an aperture mirror are disposed on an optical path of the laser beam 30, and the photodetector 15 is disposed so that the laser beam 30 emitted from the laser-beam light source 14 and reflected by the half mirror and the aperture mirror is incident on the photodetector 15.

Based on the monitored voltages Vpd, the feedback-voltage calculating section 12 calculates a reference value of a feedback voltage $V_{REF}$_ch for the laser beam 30 in each channel ch when automatic power control (APC) is performed on a light amount of the laser beam 30 emitted from the laser-beam light source 14. The reference value of the feedback voltage $V_{REF}$_ch thus obtained is supplied to the light-source controller 11. In the meantime, line APC that performs light amount correction of the laser beam 30 is applicable to the APC each time the laser beam 30 scans in the main-scanning direction.

The light-source controller 11 receives a control signal from a main CPU (not shown) that controls image formation performed by the image forming apparatus 80, and performs drive control of the laser-beam light source 14 based on the received control signal. At this time, the light-source controller 11 obtains a drive current value for use in driving the laser-beam light source 14 based on the reference value of the feedback voltage $V_{REF}$_ch fed from the feedback-voltage calculating section 12 and generates a drive signal designating the obtained drive current value to a driver 10. The drive signal is generated for each of the channels of the laser-beam light source 14 independently of each other.

When image data is fed from an image processing section (not shown) to the light-source controller 11, the light-source controller 11 generates a drive signal for use in driving the laser-beam light source 14 based on the image data and the control signal received from the main CPU.

The driver 10 generates drive currents for driving the laser-beam light source 14 in each of the channels based on the drive signal supplied from the light-source controller 11 for each of the channels of the laser-beam light source 14. The laser-beam light source 14 is turned on according to the drive currents supplied for the respective channels from the driver 10 and emits laser beams through the respective channels.

Figure 3:
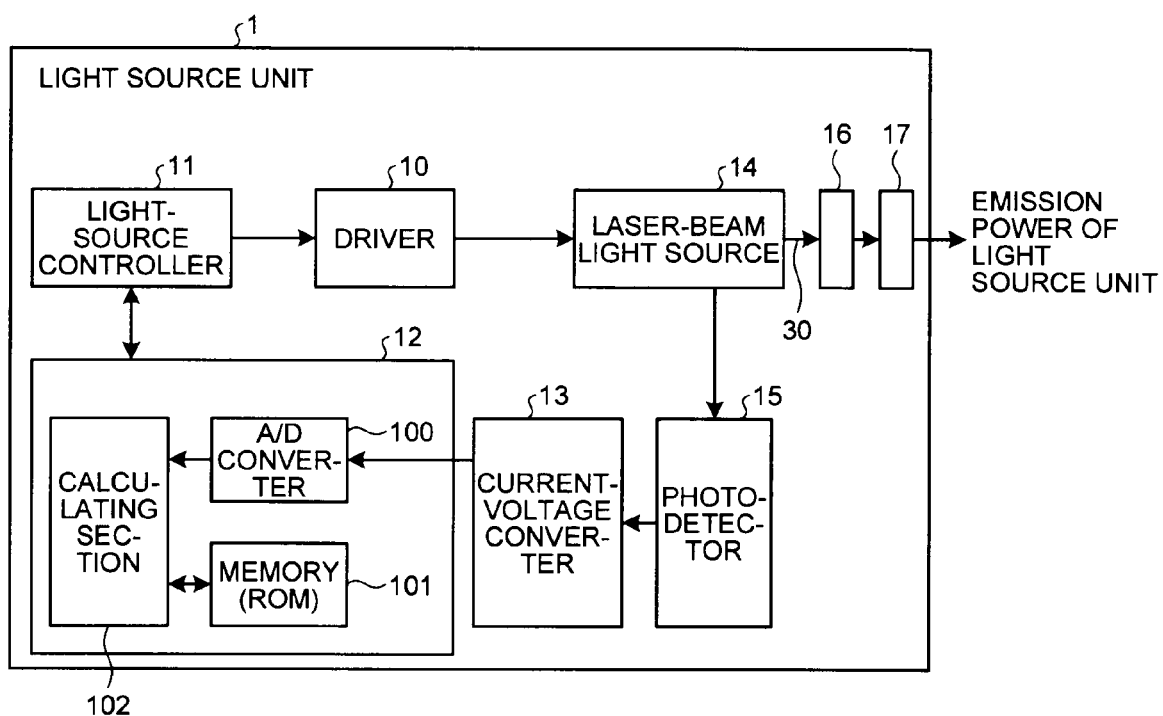
FIG. 3 is a block diagram illustrating a detailed configuration of a light source unit.

FIG. 3 is a block diagram illustrating the exemplary configuration of the light source unit 1 in detail. Note that portions that are also illustrated in FIG. 2 are indicated by the same reference numerals in FIG. 3, and repeated detailed description is omitted. Referring to FIG. 3, the feedback-voltage calculating section 12 includes an A/D converter 100, a memory 101, and a calculating section 102.

The monitored voltage Vpd supplied from the current-voltage converter 13 is converted by the A/D converter 100 into a digital value and supplied to the calculating section 102. The memory 101 includes a rewritable read only memory (ROM). A light amount P_ch is a light amount that is emitted through each of the channels ch of the laser-beam light source 14 and is measured at a corresponding one of light exit openings of the light source unit 1. A monitored voltage Vpd_ch is obtained by receiving the light amount of each of the laser beams 30. The light amount P_ch and the monitored voltage Vpd_ch are stored in the memory 101 in an associated manner. The light amounts P_ch and the monitored voltages Vpd_ch are measured in advance and stored in the memory 101 as emission power Pm_ch and monitored voltages Vm_ch, respectively.

Light use efficiency η is also stored in advance. The light use efficiency η is a ratio of the light amount of the laser beam 30 at the light exit opening of the light source unit to the light amount on a surface to be scanned, which is the photosensitive element 22, irradiated with the laser beam 30 that has passed through the optical system to become the scanning beam 31. The use efficiency η is also measured in advance and stored in the memory 101 as are the light amounts P_ch and the monitored voltages Vpd_ch described above.

Upon receiving a target light amount P of a image-surface light amount (light amount of the laser beam 30 on the surface to be scanned), on which the APC is performed, and an instruction for starting the APC from the light-source controller 11, the calculating section 102 calculates the reference value of the feedback voltage $V_{REF}$_ch for each of the laser beams 30 using the received target light amounts P, the emission power Pm ch, the monitored voltages Vm_ch, and the light use efficiency η stored in the memory 101. Here, the target light amount P is a target amount of an image-surface light amount (light amount of the laser beam 30 on the surface to be scanned) on which the APC is performed. The calculated reference value of the feedback voltages $V_{REF}$_ch are supplied to the light-source controller 11.

Light Amount Adjustment

Figure 4:
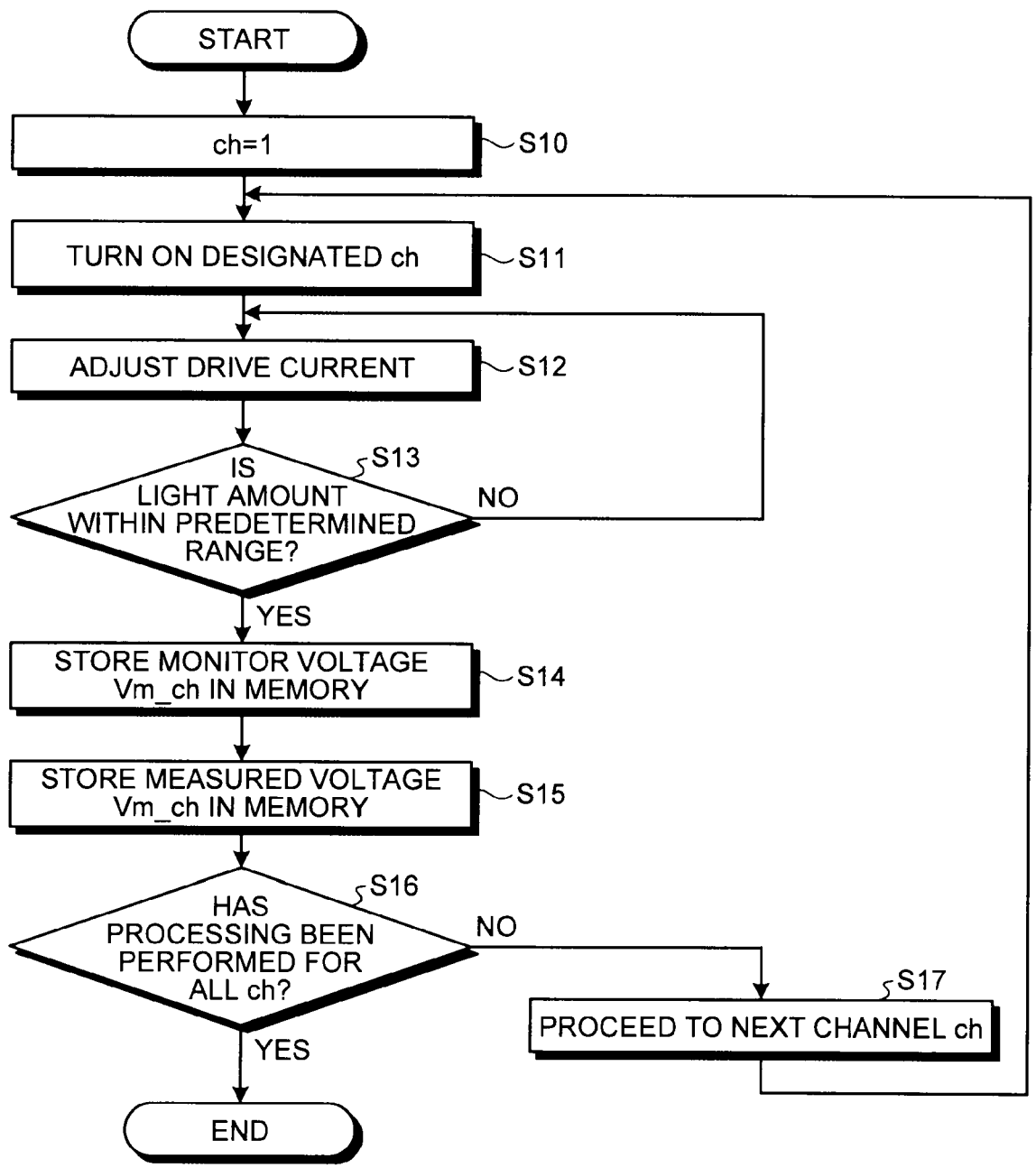
FIG. 4 is a flowchart illustrating an exemplary procedure for adjusting the light amount performed in the light source unit.

It is required that each of the laser beams 30 is adjusted so that the light amount P of the laser beam 30 falls within a predetermined range. FIG. 4 is a flowchart illustrating an example of a light amount adjusting procedure performed on the light source unit 1. The light amount adjusting procedure according to the flowchart illustrated in FIG. 4 is performed, for example, when assembly of the light source unit 1 is completed in an assembly plant that assembles the optical device.

Before performing the procedure of the flowchart, a jig (not shown) implemented by a computer, for example, is to be connected to the light-source controller 11 illustrated in FIG. 4. Thus, each of light sources that emit the laser beams 30 in the laser-beam light source 14 can be turned on or off by the control of the jig. The jig is also to be configured so that results of measurement performed at Steps S14 and S15, which will be described later, can be stored in the memory 101 by the control of the jig. Furthermore, a measurement device (power meter) is to be provided for each of the light exit openings of the laser beams 30 of the light source unit 1 to measure light amounts of the laser beams 30.

Initialization of the channel number ch is performed by assigning "1" thereto (Step S10). Subsequently, an instruction is issued from the jig to the light-source controller 11 so as to turn on a light source of the designated channel ch of the laser-beam light source 14 with direct current (Step S11). Subsequently, the power meter measures the light amount P_ch of the laser beam 30 emitted from the light source of the designated channel ch and, based on a result of the measurement, a drive current supplied to the laser-beam light source 14 is adjusted from the jig so that the light amount P_ch falls within the predetermined range (Step S12).

It is determined whether the measured light amount P_ch is within the predetermined range (Step S13). When it is determined that the light amount P_ch is within the predetermined range, control proceeds to Step S14 where the light amount P_ch is stored in the memory 101 as emission power Pm_ch (ch: 1 to 40) via the jig. A monitored voltage Vdp_ch output from the photodetector 15 on receiving the laser beam 30 having the light amount P_ch is stored as a monitored voltage Vm_ch in the memory 101 by being associated with the emission power Pm_ch (Step S15).

It is determined whether processing has been performed for all the channels of the laser-beam light source 14 (Step S16). When it is determined that there is a channel that has not been processed yet, control proceeds to Step S17 where a next channel ch is designated. Then, control is returned to Step S11. For example, the channel number is incremented by "1" to designate a new channel number. By contrast, when it is determined that processing has been performed for all the channels of the laser-beam light source 14 at Step S16, the series of light amount adjusting operations is completed.

Acquisition Procedure of Light Use Efficiency

Figure 5:
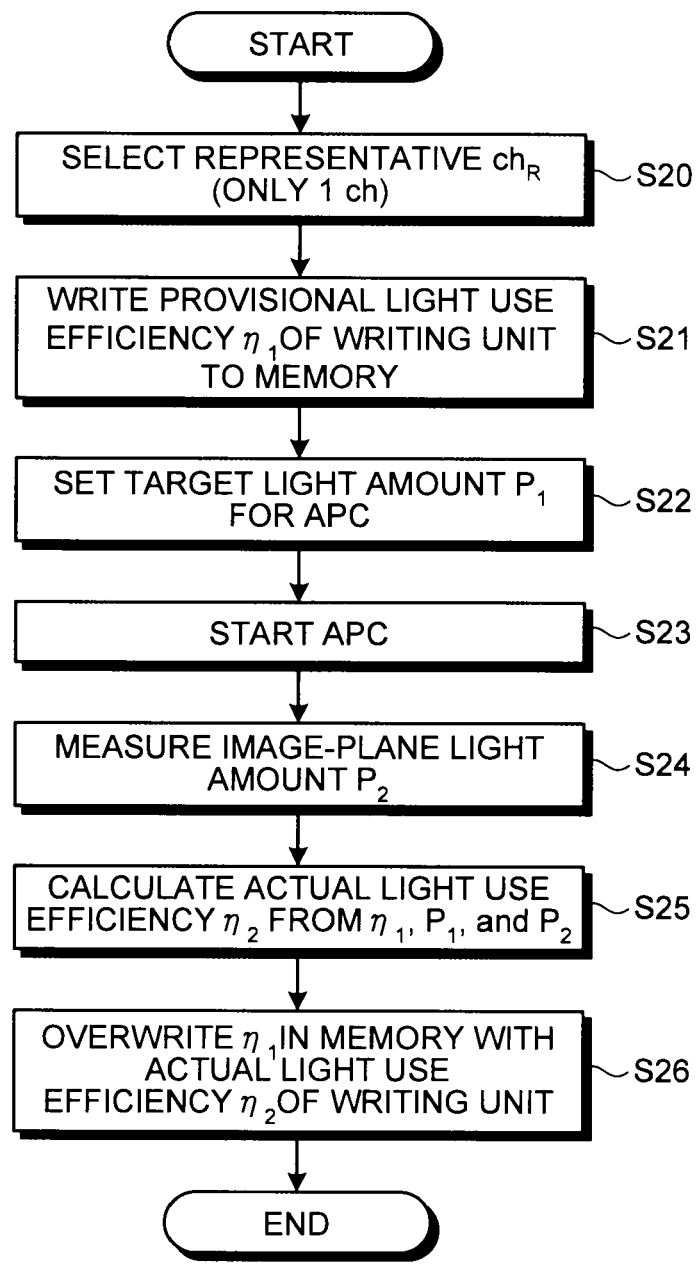
FIG. 5 is a flowchart illustrating an exemplary acquisition procedure of light use efficiency $\eta$.

FIG. 5 is a flowchart illustrating an exemplary acquisition procedure of the light use efficiency $\eta$. The acquisition procedure of the light use efficiency according to the flowchart illustrated in FIG. 5 is to be performed, for example, in a state where the light source unit 1 has been assembled into the writing unit 2 in the assembly plant of the optical device or the like.

As in the adjustment described above, before performing the procedure of the flowchart illustrated in FIG. 5, the light source unit 1 is to be configured so that the jig implemented by a computer, for example, is connected to the light-source controller 11 and each of light sources that emits the laser beam 30 in the laser-beam light source 14 can be turned on or off by the control from the jig. The light source unit 1 is also to be configured so that a result of measurement performed at Steps S26, which will be described later, can be stored in the memory 101 via the jig. In addition, a measurement device (power meter) is to be provided for each of the light exit openings of the laser beams 30 of the light source unit 1 and positions to be scanned with the laser beams 30 on the photosensitive element 22 to measure light amounts P of the laser beams 30.

In the present embodiment, the light use efficiency $\eta$ that shows use efficiency of the laser beam 30 is acquired as a ratio of the light amount P of the laser beam 30 measured at the light exit opening in the light source unit 1 to the light amount P of the laser beam 30 measured on the photosensitive element 22 which is the surface to be scanned. In the present embodiment, the light use efficiency $\eta$ is calculated on the laser beam 30 of a representative channel that is selected from the plurality of channels of the laser-beam light source 14.

Referring to FIG. 5, one representative channel $ch_R$ is selected from the plurality of channels of the laser-beam light source 14 via the jig (Step S20). Provisional light use efficiency $\eta_1$ of the writing unit 2 is written to the memory 101 (Step S21). The provisional light use efficiency $\eta_1$ can be a value calculated from characteristic values of components included in the optical system of the writing unit 2, for example. Alternatively, another value can be used as the provisional light use efficiency $\eta_1$.

Subsequently, a target light amount $P_1$, which is an image-plane light amount on which the APC is performed, is set to the light-source controller 11 from the jig (Step S22). The light-source controller 11 transmits the thus-set target light amount $P_1$ to the feedback-voltage calculating section 12.

The calculating section 102 in the feedback-voltage calculating section 12 calculates a monitored voltage $Vpd_1$ in a case where the photodetector 15 receives the laser beam 30 with which the target light amount $P_1$ is to be attained from the received target light amount $P_1$, the provisional light use efficiency $\eta_1$ stored in the memory 101 in advance, and the emission power Pm_ch and the monitored voltage Vm_ch of each of the laser beams 30 obtained and stored in the memory 101 in advance according to the procedure described above with reference to FIG. 4. The feedback-voltage calculating section 12 transmits the monitored voltage $Vpd_1$ calculated by the calculating section 102 to the light-source controller 11.

When the light-source controller 11 receives the monitored voltage $Vpd_1$ from the feedback-voltage calculating section 12, the light-source controller 11 performs the APC so that the monitored voltage Vpd that depends on an output of the photodetector 15 attains the monitored voltage $Vpd_1$, and drives the laser-beam light source 14 (Step S23). Thus, the laser beam 30, of which emission light amount has been calculated using the provisional light use efficiency $\eta_1$ so as to attain the target light amount $P_1$, is emitted only from the light source of the representative channel $ch_R$ of the laser-beam light source 14.

The power meter, disposed at a position that is to be scanned on the photosensitive element 22, measures an image-plane light amount $P_2$ (Step S24). Actual light use efficiency $\eta_2$ of the writing unit 2 is calculated from Equation (1) using the provisional light use efficiency $\eta_1$, the target light amount $P_1$, and the image-plane light amount $P_2$ (Step S25).

$$\eta_2 = (P_2/P_1) \times \eta_1 \quad (1)$$

When the actual light use efficiency $\eta_2$ of the writing unit 2 has been calculated, the actual light use efficiency $\eta_2$ is written into the memory 101 via the jig (Step S26). At this time, the provisional light use efficiency $\eta_1$ having been written into the memory 101 at Step S21 is overwritten with the actual light use efficiency $\eta_2$. This actual light use efficiency $\eta_2$ is used as the light use efficiency $\eta$ of the writing unit 2.

Meanwhile, the light use efficiency $\eta$ of the writing unit 2 can be calculated more accurately by maximizing the target light amount $P_1$ to reduce an error associated with the measurement of the image-plane light amount $P_2$.

FIG. 6 is a schematic diagram illustrating an example of contents of the memory 101 according to the present embodiment. It is assumed that the laser-beam light source 14 includes light sources for 40 channels of which channel numbers ch are "1" to "40," and is capable of emitting 40 pieces of the laser beams 30. With regard to the light source unit 1, the emission power (a light amount) Pm ch of the channels ch (ch: 1 to 40) obtained at Steps S14 and S15 in the flowchart illustrated in FIG. 4 and the monitored voltages Vm_ch corresponding to the emission power Pm_ch are stored by being associated with each other.

With regard to the writing unit 2, the light use efficiency $\eta$ acquired by the operations according to the flowchart illustrated in FIG. 5 is stored in the memory 101. The light use efficiency $\eta$ is a value specific to the writing unit 2 and common to the channels ch of the laser-beam light source 14.

A light amount adjusting process according to a conventional technology to which the present embodiment is not applied and a light amount adjusting process to which the present embodiment is applied are described below with reference to FIG. 7 and FIG. 8, respectively. Note that portions that are also illustrated in FIG. 2 are indicated by the same reference numerals in FIGS. 7 and 8, and repeated detailed description is omitted.

Figure 7:
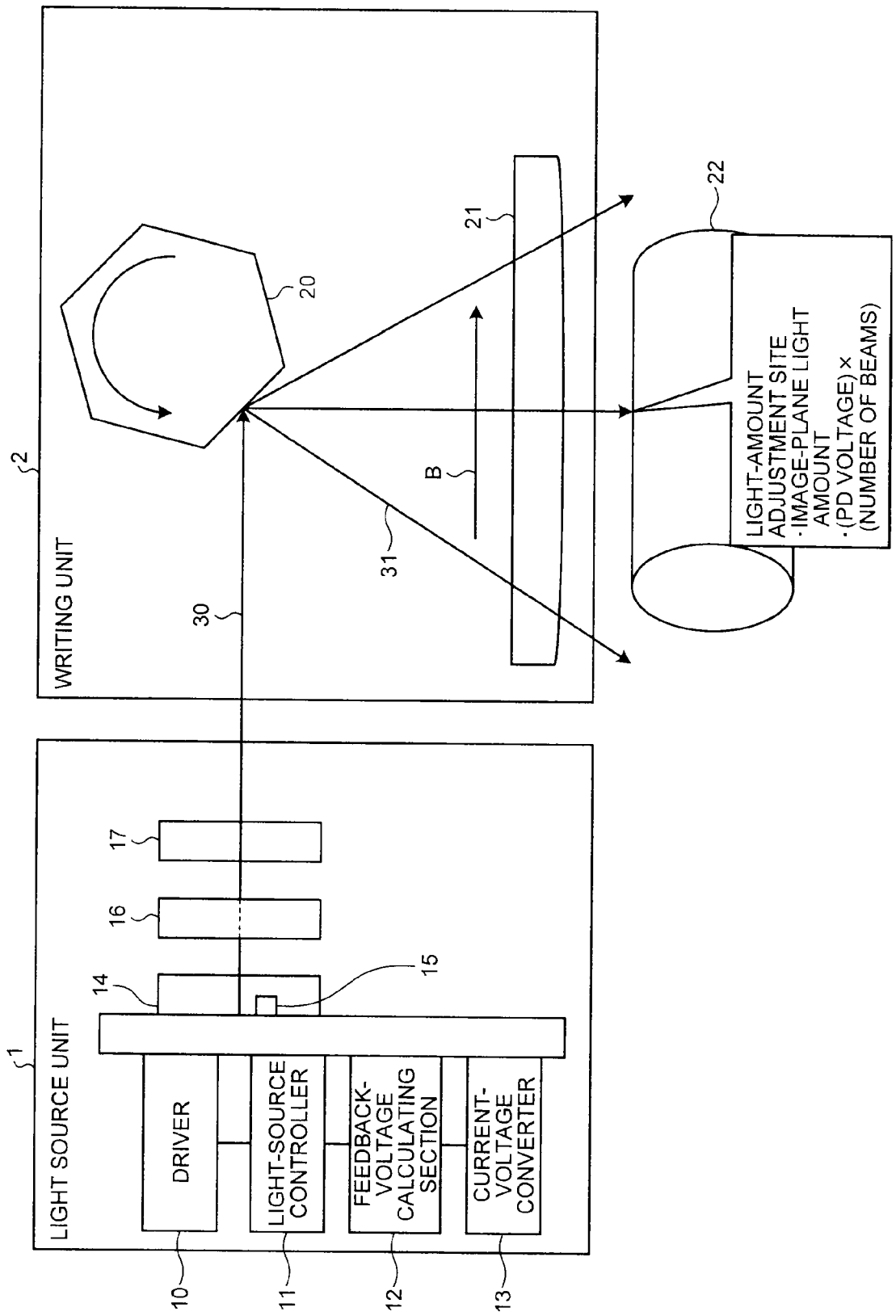
FIG. 7 is a schematic diagram illustrating an example of a light amount adjusting process according to a conventional technology.

FIG. 7 is a schematic diagram illustrating an example of the light amount adjusting process according to the conventional technology. When the present embodiment is not applied, light amount adjustment is performed based on a light amount (image-plane light amount) on the photosensitive element 22 which is the surface to be scanned with the laser beam 30. More specifically, the image-plane light amount on the photosensitive element 22 irradiated with the laser beam 30 is measured using a power meter or the like. Based on a result of the measurement, the emission power of the laser-beam light source 14 is adjusted by changing a driving current of the PD so that the image-plane light amount falls within a predetermined range. This series of operations is performed on each of the laser beams 30 of the plurality of channels ch of the laser-beam light source 14.

Figure 8:
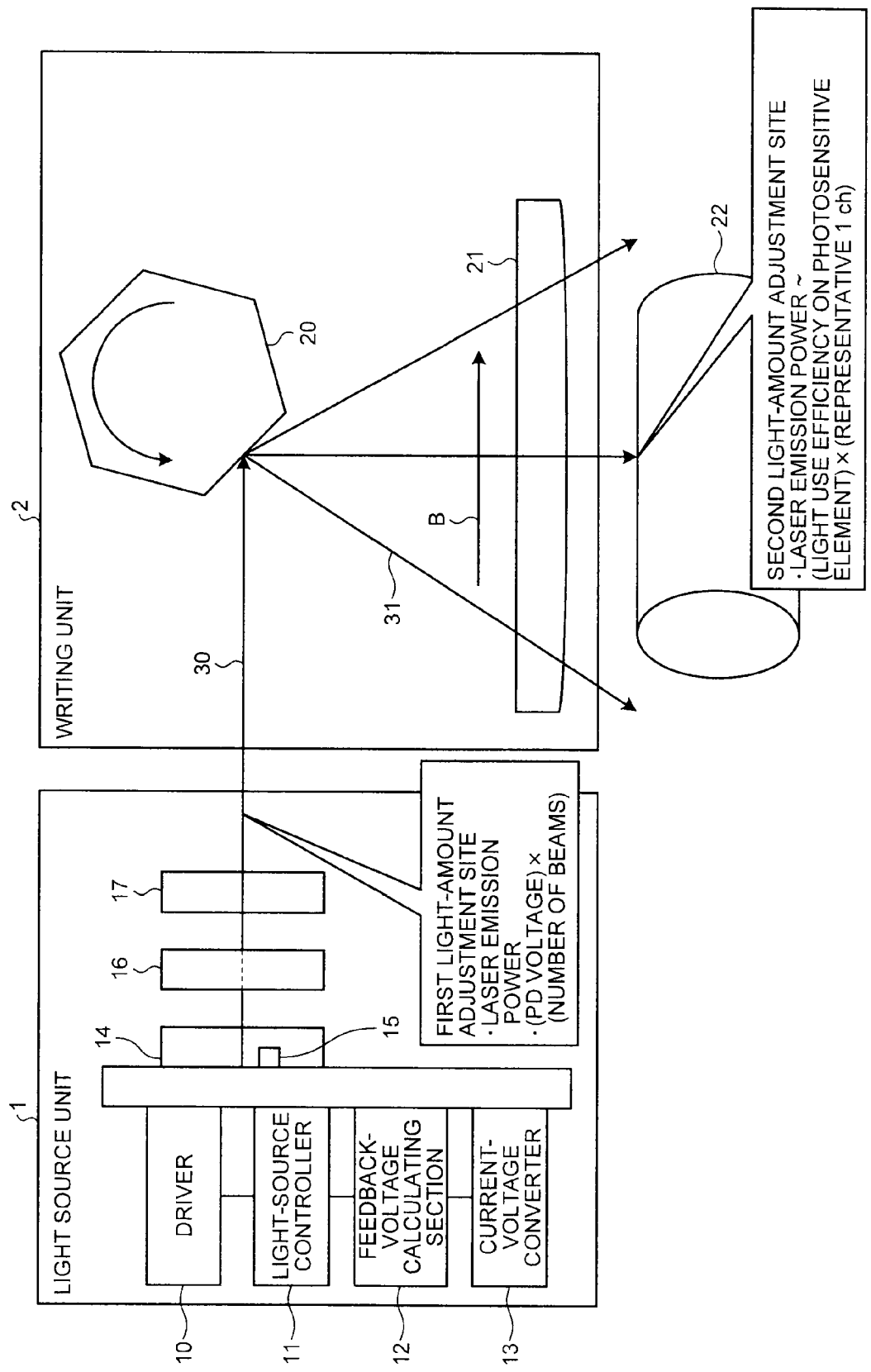
FIG. 8 is a schematic diagram illustrating an example of a light amount adjusting process according to the embodiment.

FIG. 8 is a schematic diagram illustrating an example of the light amount adjusting process to which the present embodiment is applied. In this process, the light amount adjustment is performed at a first adjustment site and at a second adjustment site. At the first adjustment site, for example, as described above with reference to the flowchart illustrated in FIG. 4, the drive currents for the laser-beam light source 14 of the light source unit 1 are adjusted; the emission power Pm_ch obtained as a result of the adjustment and the corresponding monitored voltage Vm_ch are measured for each of the channels ch and written to the memory 101 prior to shipment from the plant.

Subsequently, at the second light amount adjusting site, as described above with reference to the flowchart illustrated in FIG. 5, the laser beam 30 is emitted only through the representative channel $ch_R$ to illuminate the photosensitive element 22; the APC is performed so that the image-plane light amount $P_2$ attains the target light amount $P_1$; and the image-plane light amount $P_2$ is measured when light amount is stabilized. The actual light use efficiency $\eta_2$ is calculated from Equation (1) using the provisional light use efficiency $\eta_1$, the target light amount $P_1$, and the image-plane light amount $P_2$, and written to the memory 101 as the light use efficiency $\eta$ of the writing unit 2.

In the above description, the emission power Pm_ch, the monitored voltages Vm_ch, and the light use efficiency $\eta$ are stored in the same memory 101; however, the embodiment is not limited thereto, and the emission power Pm_ch, the monitored voltages Vm_ch, and the light use efficiency $\eta$ may be stored in memories which are different from each other.

APC Operation

An APC operation applicable to the present embodiment is described below. In the description below, it is assumed that the laser-beam light source 14 includes light-emitting points for the 40 channels and can emit the laser beams 30 of channel numbers "1" to "40" independently of each other.

When the APC operation is performed, the reference value of the feedback voltage $V_{REF\_}$ch is calculated for each of the channels ch using the light use efficiency $\eta$ of the writing unit 2, and the emission power Pm_ch and the monitored voltage Vm_ch of each of the channels stored in the memory 101 in advance and Equation (2) below so that the APC brings the image-plane light amount $P_2$ to the target light amount $P_1$.

$$V_{REF\_}ch=(Vm\_ch/Pm\_ch)\times(P_1/\eta) \quad (2)$$

Figure 9:
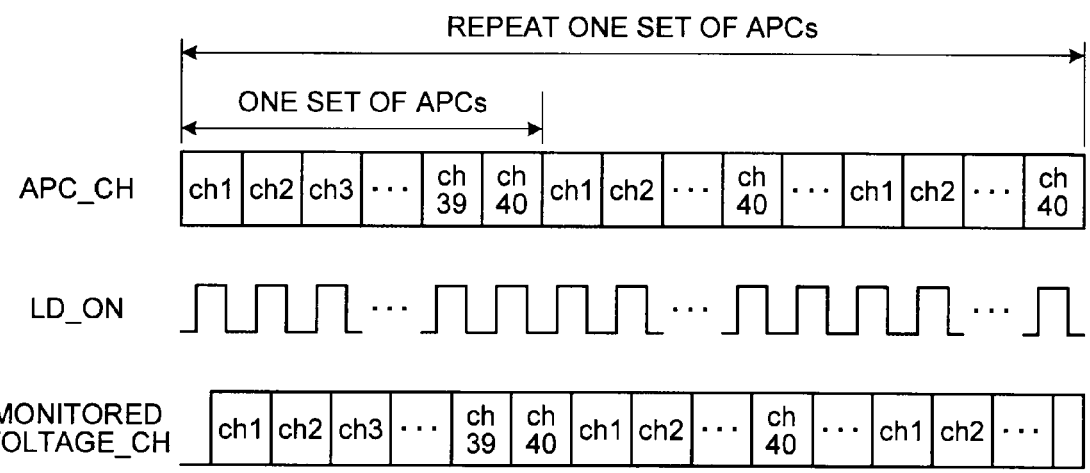
FIG. 9 is a timing diagram illustrating an example of an initialization process of Automatic Power Control (APC)

FIG. 9 is a timing diagram illustrating an example of initialization of the APC. In FIG. 9, APC_CH denotes a channel ch for which the APC is performed; LD_ON denotes that the laser beam 30 is to be emitted from the laser-beam light source 14 at "H." The MONITORED VOLTAGE_CH denotes a channel ch where the monitored voltage Vpd is obtained. During the initialization, the APC is performed for each of the channels of the laser-beam light source 14 so that a single set of the APCs that includes the APCs on all the channels, or, in other words, the APCs on the 40 channels, is repeatedly performed as illustrated in FIG. 9.

Prior to operations according to the timing diagram illustrated in FIG. 9, first, the main CPU (not shown) that controls the image formation performed by the image forming apparatus 80 transmits the target light amount $P_1$ for the APC and an APC start signal to the light-source controller 11. The light-source controller 11 transfers the received target light amount $P_1$ to the feedback-voltage calculating section 12.

The calculating section 102 in the feedback-voltage calculating section 12 calculates the reference value of the feedback voltage $V_{REF\_}$ch for each of the channels ch from Equation (2) described above using the light use efficiency $\eta$ of the writing unit 2, and the emission power Pm_ch and the monitored voltage Vm_ch of each of the channels stored in the memory 101. When the calculating section 102 has calculated the reference value of the feedback voltages $V_{REF\_}$ch for all the channels, the calculating section 102 transmits signals indicating completion of calculation of the reference value of the feedback voltages $V_{REF\_}$ch and an initial drive current for starting the APC operation on the laser-beam light source 14.

Subsequently, the light-source controller 11 causes the channel ch of which a channel number is "1" to be lit with the initial drive current which has been received from the feedback-voltage calculating section 12, and transmits a signal indicating that the channel ch is lit to the feedback-voltage calculating section 12. When receiving the signal indicating that the channel ch of which the channel number is "1" is lit, the feedback-voltage calculating section 12 obtains an output of the photodetector 15 at this time as a voltage via the current-voltage converter 13 and converts the voltage into a digital value through the A/D converter 100.

The feedback-voltage calculating section 12 compares the thus-obtained digital value of the monitored voltage Vpd and the reference value of the feedback voltage $V_{REF\_}$ch of the channel ch of which the channel number is "1" to determine a drive current value with which the monitored voltage Vpd is close to the reference value of the feedback voltage $V_{REF\_}$ch. The feedback-voltage calculating section 12 transmits the drive current value to the light-source controller 11 as a current value to be supplied when the channel ch of which the channel number is "1" is lit in the next time. The above series of operations is repeatedly performed until the channel number reaches "40," and then the above set of operations is repeated again from the channel ch of which the channel number is "1" as illustrated in FIG. 9.

The number of times a single set of the operations on all the output channels of the laser-beam light source 14 is repeated is preset in the light-source controller 11 as the number of repetition that is expected to cause each of the monitored voltages Vpd of all the channels ch to be stabilized and become substantially equal to the reference value $V_{REF\_}$ch of the respective channels ch. The initialization has thus been completed. The initialization is performed for determining the drive current value of the laser-beam light source 14 at the start of printing performed by the image forming apparatus 80.

Figure 10:
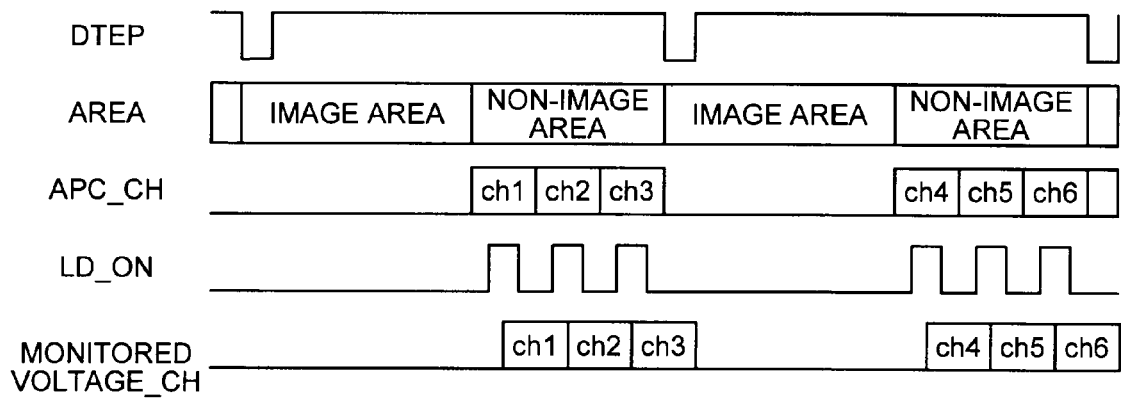
FIG. 10 is a timing chart illustrating an example of the APC in synchronization with a synchronization signal after the initialization.

FIG. 10 is a timing chart illustrating an example of the APC operation in synchronization with a synchronization signal after the initialization. In FIG. 10, a synchronization signal DTEP is a signal that is generated when a synchronization detector (not shown) arranged on one end of the photosensitive element 22 detects passage of the scanning beam 31 above the synchronization detector and is transmitted to the light-source controller 11. The synchronization signal DTEP serves as a reference signal for determining a write-start position on the photosensitive element 22 and is generated for each scanning process performed by the scanning beam 31. As illustrated in FIG. 10 as areas, intervals between synchronization signal DTEP and a next synchronization signal DTEP are classified into image areas and non-image areas.

The image area corresponds to a period when the scanning beam 31 scans across a surface of the photosensitive element 22. The non-image area corresponds to a period when the scanning beam 31 goes out of the surface of the photosensitive element 22 after performing scanning. The APC in synchronization with the synchronization signal DTEP is performed in the non-image area.

After the initialization process described above is completed, the APC is performed in synchronization with the synchronization signal DTEP. APC operations in synchronization with the synchronization signal DTEP are similar to the APC operations performed during the initialization process described above. More specifically, the channels ch of the laser-beam light source 14 are caused to lit one by one in a sequential order, and the monitored voltage Vdp obtained when each of the channels ch is lit is fed back to the feedback-voltage calculating section 12 to determine a drive current value to be supplied to the laser-beam light source 14 in the next operation.

Meanwhile, operation time devoted to the non-image area is limited. Accordingly, during a normal printing operation that starts after completion of the initialization process, the number of channels ch on which the APC can be performed in one non-image area is also limited. FIG. 10 illustrates the example in which the APC operations corresponding to three channels are performed over a time period that corresponds to one operation over the non-image area. An aim of using the APC that is synchronized with the synchronization signal DTEP is to keep a light amount of the laser beam 30 emitted from the laser-beam light source 14 unchanged even when ambient temperature of the laser-beam light source 14 and/or the like varies during a printing operation by the image forming apparatus 80. This aim can be achieved by performing the APC on a plurality of channels sequentially in each of the non-image areas during scanning performed with the scanning beam 31 on the photosensitive element 22.

As described above, according to the present embodiment, the reference value of the feedback voltage $V_{REF\_ch}$ is determined by applying the light use efficiency η that indicates laser-beam use efficiency of the writing unit 2 to the output of the photodetector 15 of the light source unit 1 in the APC. Accordingly, it is possible to perform the APC that is close in state to APC performed by directly measuring an image-plane light amount on the photosensitive element 22 illuminated with the scanning beam 31, thereby increasing accuracy of the APC.

First Modification of the Embodiment

A first modification of the embodiment is described below. In the embodiment described above, the actual light use efficiency $\eta_2$ is calculated by causing only one channel ch, among the plurality of channels, of the laser-beam light source 14 to emit the laser beam 30; however, the calculation method of the actual light use efficiency $\eta_2$ is not limited thereto. In the first modification of the embodiment, two or more channels among the plurality of channels of the laser-beam light source 14 are caused to emit a plurality of laser beams 30 simultaneously, and the actual light use efficiency $\eta_2$ is calculated using an image-plane light amounts $P_2'$ of the plurality of laser beams.

Figure 11:
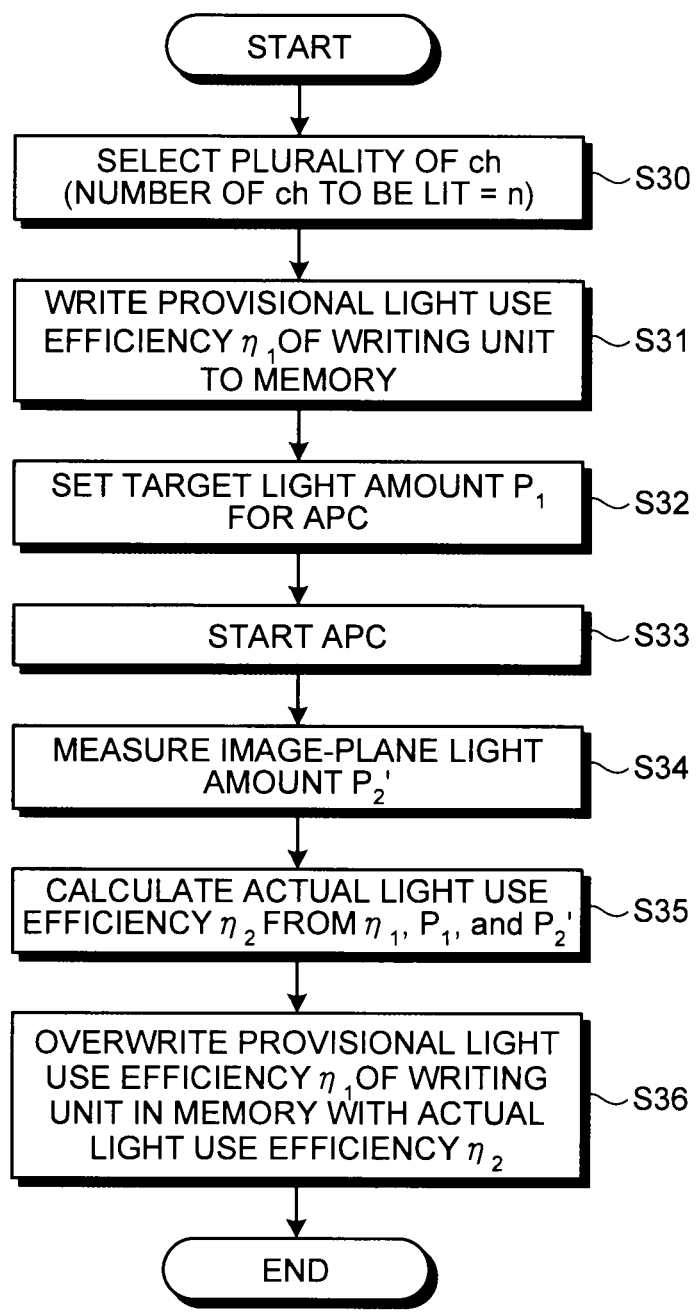
FIG. 11 is a flowchart illustrating an exemplary acquisition procedure of the light use efficiency $\eta$ according to a first modification of the embodiment in a case where a plurality of laser beams is used.

FIG. 11 is a flowchart illustrating an exemplary acquisition procedure of the light use efficiency η in a case where the plurality of laser beams 30 is used. Note that also in this case, conditions on the arrangement of the jig and the power meter and the like are similar to those in the procedure for the operations using the single laser beam 30 described above with reference to the flowchart illustrated in FIG. 5. In addition, Steps S30 to S36 in FIG. 11 correspond to Step S20 to Step S26 in FIG. 5, respectively. Hence, operations illustrated in FIG. 11 different from those illustrated in FIG. 5 are mainly described below.

Referring to FIG. 11, n channels $ch_1$, $ch_2$, . . . , and $ch_n$ (n is two or more) are selected via the jig from the plurality of channels of the laser-beam light source 14 (Step S30). The provisional light use efficiency $\eta_1$ of the writing unit 2 is written to the memory 101 (Step S31).

Subsequently, the target light amount $P_1$ toward which the APC is performed is set to the light-source controller 11 via the jig (Step S32). The light-source controller 11 transmits the thus-set target light amount $P_1$ to the feedback-voltage calculating section 12. From the received target light amount $P_1$, the provisional light use efficiency $\eta_1$, the emission power Pm_ch, and the monitored voltage Vm_ch, the feedback-voltage calculating section 12 calculates the monitored voltage $Vpd_1$ in a case when the photodetector 15 receives the laser beam 30 with which the image-plane light amount attains the target light amount $P_1$. The provisional light use efficiency $\eta_1$, the emission power Pm_ch, and the monitored voltage Vm_ch used in the calculation are stored in the memory 101 in advance. The monitored voltage $Vpd_1$ obtained by the calculation is transmitted to the light-source controller 11.

When the light-source controller 11 receives the monitored voltage $Vpd_1$ from the feedback-voltage calculating section 12, the light-source controller 11 performs the APC so that the monitored voltage Vpd that depends on an output of the photodetector 15 becomes the monitored voltage $Vpd_1$, and drives the laser-beam light source 14 (Step S33). Thus, a plurality of the laser beam 30, which have been calculated to have the target light amount $P_1$ by using the provisional light use efficiency $\eta_1$, are emitted from each of the channels $ch_1$, $ch_2$, . . . , and $ch_n$ that are selected in the laser-beam light source 14.

The power meter arranged at a to-be-scanned position on the photosensitive element 22 measures the image-plane light amount $P_2'$ (Step S34). The image-plane light amount $P_2'$ measured at Step S34 is a summation of each of the image-plane light amounts $P_2$ of the laser beams 30 from the plurality of channels $ch_1$, $ch_2$, . . . , and $ch_n$.

The actual light use efficiency 12 of the writing unit 2 is calculated from Equation (3) below using the provisional light use efficiency $\eta_1$, the target light amount $P_1$, and the image-plane light amount $P_2'$ (Step S35).

$$\eta_2 = \{P_2'/(P_1 \times n)\} \times \eta_1 \qquad (3)$$

When the actual light use efficiency $\eta_2$ of the writing unit 2 is calculated, the provisional light use efficiency $\eta_1$ in the memory 101 is overwritten with the actual light use efficiency $\eta_2$ via the jig (Step S36). This actual light use efficiency $\eta_2$ is used as the light use efficiency η of the writing unit 2.

In the first modification of the embodiment, the light use efficiency η is calculated using the plurality of laser beam 30 as described above. Accordingly, a large value can be set to the light-source controller 11 as the target light amount $P_1$ for the APC. Therefore, measurement error of the image-plane light amount $P_2'$ that is actually measured can be reduced as compared to that of the embodiment described above, and the light use efficiency η of the writing unit 2 can be calculated more accurately.

Second Modification of the Embodiment

A second modification of the embodiment is described below. The second modification of the embodiment is an example in application of the embodiment to a writing unit that employs the beam-splitting method. The beam-splitting method is performed so that each of the laser beams 30 is split into two beams using an optical splitting prism and two polygon mirrors having different angles of reflection. These two laser beams are caused to be incident on photosensitive elements which are different from each other.

Figure 12:
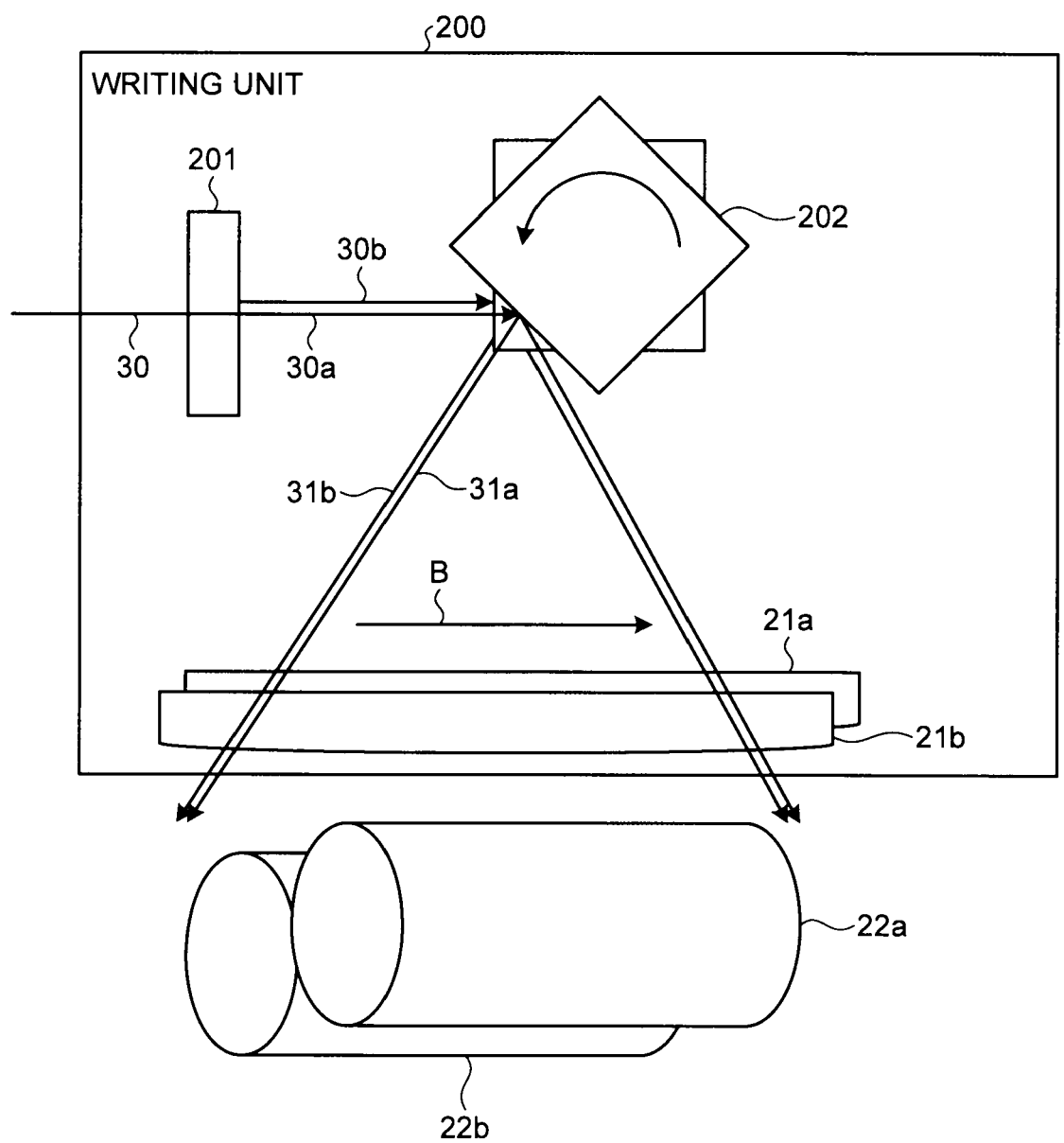
FIG. 12 is a schematic diagram illustrating an exemplary configuration of a writing unit to which a beam-splitting method is applied.

FIG. 12 is a schematic diagram illustrating an exemplary configuration of a writing unit 200 to which the beam-splitting method is applied. Note that portions that are also illustrated in FIG. 2 are denoted by the same reference numerals in FIG. 12, and detailed description is not repeated. As a light source unit that causes the laser beam 30 to be incident on the writing unit 200, the light source unit 1 described in the above embodiment with reference to FIGS. 2 and 3 can be used, and repeated description is omitted.

The writing unit 200 includes a polygon mirror 202 that includes an upper mirror portion and a lower mirror portion each having four faces that are out of phase with each other by 45°, for example. Each of the laser beams 30 emitted from the light source unit 1 is split by an optical splitting prism 201 into two beams that are called split beams 30a and 30b. The split beams 30a and 30b are caused to be respectively incident on the upper mirror portion and the lower mirror portion of the polygon mirror 202, where the lower mirror portion is set to be out of phase with the upper mirror portion by 45°. A scanning beam 31a which is the split beam 30a reflected by the upper mirror portion of the polygon mirror 202 is incident on a first-color photosensitive element 22a after passing through an fθ lens 21a. Similarly, a scanning beam 31b which is the split beam 30b reflected by the lower mirror portion of the polygon mirror 202 is incident on a second-color photosensitive element 22b after passing through an fθ lens 21b. The scanning beams 31a and 31b scan the photosensitive elements 22a and 22b, respectively, in a main-scanning direction (indicated by arrow B in FIG. 12) as the polygon mirror 202 rotates.

When the writing unit 200 that employs the beam-splitting method as described above is used, light amount adjustment of the light source unit 1 prior to shipment from the plant is performed as in the processes according to the embodiment described above with reference to the flowchart illustrated in FIG. 4. The provisional light use efficiency $\eta_1$ is set for each of the first-color photosensitive element 22a and the second-color photosensitive element 22b as provisional light use efficiency $\eta_{1a}$ and provisional light use efficiency $\eta_{1b}$, respectively. The provisional light use efficiency $\eta_{1a}$ and provisional light use efficiency $\eta_{1b}$ are written into the memory 101, and are eventually overwritten with actual light use efficiency $\eta_{2a}$ and actual light use efficiency $\eta_{2b}$ calculated for the first-color and second-color photosensitive elements 22a and 22b, respectively.

FIG. 13 is a diagram illustrating an example of contents of the memory 101 according to the second modification. It is assumed that the laser-beam light source 14 includes light sources for the 40 channels to which channel numbers are "1" to "40" are assigned, and is capable of emitting 40 beams of the laser beams 30. With regard to the light source unit 1, the emission power Pm_ch and the monitored voltages Vm_ch obtained when laser beams of the emission power Pm_ch are emitted are associated with each other for each of the channels and stored as in the example described above with reference to FIG. 6.

With regard to the writing unit 200, the actual light use efficiency $\eta_{2a}$ for the first-color photosensitive element 22a and the actual light use efficiency $\eta_{2b}$ for the second-color photosensitive element 22b are obtained as described above. The actual light use efficiency $11_{2a}$ and actual light use efficiency $\eta_{2b}$ are stored in the memory 101 as light use efficiency $\eta_a$ and light use efficiency $\eta_b$ that are common to all the channels ch of the laser-beam light source 14 of the light source unit 1.

Reference values of feedback voltages $V_{REF}\_ch_a$ and $V_{REF}\_ch_b$ for each of the channels ch that are set as target light amounts $P_a$ and $P_b$ for image-plane light amounts of the photosensitive elements 22a and 22b, respectively, are calculated from Equation (2) described above.

It is also possible to combine the second modification and the first modification described above.

According to the second modification of the present embodiment, even when the laser beam 30 is split into two scanning beams 31a and 31b in the writing unit 200, information to be stored in the memory 101 is increased only by an amount corresponding to the light use efficiency $\eta$ as compared with the configuration in which the scanning beam 31 remains as a single beam. Accordingly, an increase in storage capacity of the memory 101 can be saved.

The use efficiency $\eta_a$ and use efficiency $\eta_b$ associated with the split beam 30a and 30b, respectively, can be obtained by measuring only the laser beam 30 of the representative channel $ch_R$ among the plurality of channels ch of the laser-beam light source 14. Accordingly, even when the laser beams 30 are split by using the beam-splitting method, time to be consumed in the light amount adjustment is not largely changed compared with that of a normal method in which the laser beams 30 are not split.

According to an aspect of the embodiment, there is yielded an effect of improved accuracy in adjusting amounts of light of laser beams emitted from a laser-beam light source capable of simultaneously emitting a plurality of laser beams.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:
1. An optical device comprising:
a light source that emits a plurality of laser beams;
a detecting unit that detects the laser beams emitted from the light source and converts light amounts of the detected laser beams into voltage values to be output;
a first storage unit that stores in advance a light amount to be output for each of the laser beams and the voltage value corresponding to the light amount in an associated manner;
a second storage unit that stores in advance a value indicating light use efficiency of an optical system that guides the laser beams to a surface to be scanned for scanning;
a calculating unit that calculates a target voltage value, which is the voltage value to be output from the detecting unit when the surface to be scanned is irradiated with the laser beam at a preset target light amount, for each of the laser beams based on the light amount and the voltage value, which are stored in the first storage unit, and also based on the value indicating the light use efficiency stored in the second storage unit; and
a control unit that controls emission power for each of the laser beams emitted from the light source so that the voltage value output from the detecting unit approaches the target voltage value calculated by the calculating unit.

2. The optical device according to claim 1, wherein
the optical system splits each of the laser beams emitted from the light source to generate a plurality of split laser beams and guides the split laser beams to different surfaces to be scanned from each other for scanning, and
the second storage unit stores in advance a value indicating light use efficiency of each of the split laser beams of the optical system.

3. The optical device according to claim 1, wherein
the light use efficiency is obtained by causing the light source to emit one laser beam among the laser beams and by calculating a ratio of a light amount of the one laser beam to another light amount on the surface to be scanned when the one laser beam scans the surface to be scanned after passing through the optical system.

4. The optical device according to claim 1, wherein
the light use efficiency is obtained by causing the light source to emit a plurality of laser beams and by calculating a ratio of a light amount of the plurality of laser beams to another light amount on the surface to be scanned when the plurality of laser beams scan the surface to be scanned after passing through the optical system.

5. A method for controlling an optical device, the method comprising:
detecting, performed by a detecting unit, a laser beam emitted from the light source used for emitting a plurality of the laser beams, converting a light amount of the detected laser beam into a voltage value, and outputting the voltage value;
calculating, performed by a calculating unit for each of the plurality of laser beams, a target voltage value that is the voltage value to be output at the detecting when the surface to be scanned is irradiated with the laser beam at a preset target light amount based on an output light amount for each of the laser beams and the voltage value associated with the output light amount stored in a first storage unit and a value, stored in a second storage unit, indicating light use efficiency of an optical system that guides the laser beams to the surface to be scanned and causes the laser beams to scan the surface to be scanned; and
controlling, performed by a control unit, emission power of the laser beams emitted from the light source so that the voltage value output at the detecting approaches the target voltage value calculated at the calculating.

6. An optical device comprising:
a light emitting means for emitting a plurality of laser beams;
a detecting means for detecting the laser beams emitted from the light emitting means and converting light amounts of the detected laser beams into voltage values to be output;
a first storage means for storing in advance a light amount to be output for each of the laser beams and the voltage value corresponding to the light amount in an associated manner;
a second storage means for storing in advance a value indicating light use efficiency of an optical means for guiding the laser beams to a surface to be scanned for scanning;
a calculating means for calculating a target voltage value, which is the voltage value to be output from the detecting means when the surface to be scanned is irradiated with the laser beam at a preset target light amount, for each of the laser beams based on the light amount and the voltage value, which are stored in the first storage means, and also based on the value indicating the light use efficiency stored in the second storage means; and
a control means for controlling emission power for each of the laser beams emitted from the light emitting means so that the voltage value output from the detecting means approaches the target voltage value calculated by the calculating means.

* * * * *